United States Patent [19]

Moran

[11] Patent Number: 4,977,107
[45] Date of Patent: Dec. 11, 1990

[54] METHOD FOR MANUFACTURING SEMICONDUCTOR RECTIFIER

[75] Inventor: John D. Moran, Mesa, Ariz.
[73] Assignee: Motorola Inc., Schaumburg, Ill.
[21] Appl. No.: 397,206
[22] Filed: Aug. 23, 1989
[51] Int. Cl.$^5$ .......................................... H01L 21/302
[52] U.S. Cl. ..................................... 437/225; 437/15; 437/228; 437/904
[58] Field of Search ............... 357/20, 55, 47; 437/15, 437/154, 203, 228, 66, 67, 78, 904

[56] References Cited

U.S. PATENT DOCUMENTS

| | | | |
|---|---|---|---|
| 4,040,084 | 8/1977 | Tanaka et al. | 357/20 |
| 4,524,376 | 6/1985 | Cornick | 357/20 |
| 4,636,269 | 1/1987 | Boland | 437/78 |

FOREIGN PATENT DOCUMENTS

| | | | |
|---|---|---|---|
| 0027072 | 4/1981 | European Pat. Off. | 357/55 |
| 0008982 | 1/1979 | Japan | 357/20 |
| 0076568 | 6/1981 | Japan | 437/154 |
| 0096773 | 6/1983 | Japan | 357/20 |
| 0064161 | 4/1986 | Japan | 437/15 |

*Primary Examiner*—Brian E. Hearn
*Assistant Examiner*—Trung Dang
*Attorney, Agent, or Firm*—Robert M. Handy

[57] ABSTRACT

Rectifiers of excellent characteristics may be more economically fabricated by a process in which a cavity is first etched in a non-epitaxial semiconductor wafer to a depth in the range of typically 15-25 percent of the initial wafer thickness. Simultaneous diffusion of N and P type dopants is used to provide (for an N type substrate) a P+ region in the bottom of the cavity and surrounding surface, and an N+ region on the opposite face of the wafer. A mask is then provided in the cavity bottom and the surrounding wafer regions etched to remove the P+ dopant outside the cavity thereby re-exposing the surrounding region of the original N type substrate. The P+ region may be level with or protrude slightly from the substrate surface. The junction formed between the P+ region in the cavity bottom and the N type substrate has a gradual contour where it intersects the surface thereby providing a more favorable field distribution. Passivation and metallization are provided in the conventional manner. The resulting devices may be fabricated in very thin wafers without significant mechanical breakage loss.

12 Claims, 2 Drawing Sheets

METHOD FOR MANUFACTURING SEMICONDUCTOR RECTIFIER

FIELD OF THE INVENTION

This invention concerns improved means and methods for semiconductor devices and, more particularly, improved means and methods for semiconductor junctions, especially those used for forming rectifiers.

BACKGROUND OF THE INVENTION

It is well known in the electronic arts to manufacture semiconductor junctions for a variety of purposes. For example, diodes are formed using a single junction, and transistors, thyristors, and other devices are formed with multiple junctions. Silicon is the most commonly used semiconductor material but other semiconductor materials are also well known.

Diodes or rectifiers are the simplest types of semiconductor devices formed using a single PN junction. Many different types of rectifiers are known. For example, some are constructed in epitaxial layers formed on semiconductor substrates using planar technology. While very small devices may be formed in this fashion, such techniques are not particularly desirable for large area rectifiers because of the high material cost associated with the epitaxial wafers, the higher process costs associated with the planar technology, and the more limited reverse voltage capability of the resulting rectifier.

Another commonly used technology for constructing power rectifiers is to form the rectifier in a "mesa" structure. Sometimes these are formed in epitaxial material and sometimes directly in the original starting substrate. The use of the mesa type structure provides improved control of the fringing electric fields at the edges of the PN junction where it meets the surface so that the reverse leakage current is reduced and reverse voltage breakdown increased.

Mesa diodes constructed on epitaxial material however are expensive because of the high cost of the starting material. While the material cost for non-epitaxial mesa structures is lower, in order to achieve reasonable forward voltage drops, the starting substrate material must be extremely thin, or must be etched to reduce its thickness during processing. Cutting the mesas reduces the mechanical strength of the wafer. Such wafers are more likely to break during processing, reducing overall manufacturing yield and increasing cost.

Accordingly, there continues to be a need for improved structures and methods for forming semiconductor junctions used for rectifiers and other devices, which overcome one or more limitations of the prior art.

BRIEF SUMMARY OF THE INVENTION

It is an object of the present invention to provide an improved means and method for semiconductor devices employing at least one PN junction.

It is a further object of the present invention to provide an improved means and method particularly adapted for forming rectifying junctions in non-epitaxial wafers.

The foregoing and other objects and advantages are achieved by a process for forming a semiconductor device, comprising, providing a semiconductor substrate having first and second principal surfaces separated by a first distance, forming a cavity extending from the first surface a second distance into the substrate, introducing a dopant to a third distance into the cavity and into a remaining part of the first surface laterally outside the cavity, and removing some or all of the remaining part of the first surface so that the doped portion of the cavity is exposed and is surrounded by at least some newly exposed substrate not containing the dopant.

The step of removing the remaining part of the first surface is conveniently accomplished by etching. It is desirable that the wafer have a first conductivity type and that the dopant introduced into the floor and sides of the cavity and into the remaining part of the first surface be of opposite conductivity type. It is further desirable that the second principal surface of the substrate be provided with a dopant of the first conductivity type at the same time that dopant is provided in the cavity and the remaining part of the first surface.

The cavity is conveniently formed by etching to a depth that is approximately 15-25 percent of the initial wafer thickness. At the same time that the cavity is formed, the rear face of the wafer is etched so as to remove approximately the same thickness of material as is removed in forming the cavity. Thus, after etching the cavity and the rear face, the distance between the bottom of the cavity and the newly etched rear face of the wafer is approximately 50-70 percent of the initial wafer thickness.

The above-described process provides a PN junction whose surface intersection has a contour which provides for better control of the electric field than is attained with planar devices, and therefore lower leakage and improved breakdown voltage. Further, the above-described process automatically provides substantial etching of all of the surfaces of the wafer, so that structural damage associated with sawing or polishing the starting wafer is eliminated automatically. Thus, the customary initial damage removal etch is avoided and the manufacturing process made simpler and less expensive. In addition, the above-described process eliminates the need for masking of the wafer during doping. This further reduces the manufacturing cost.

As used herein, the words, "diode" and "rectifier" are intended to be interchangeable and refer to semiconductor devices having at least one PN junction, and to thereby include multi-junction devices, as for example, transistors or thyristors. For convenience of explanation, the present invention is described as for a single junction device, but those of skill in the art will appreciate based on the description herein, that it is also applicable to multijunction devices.

The invented means and method will be better understood by considering the accompanying drawings and explanation that follow.

As an aid to understanding the figures, dielectric regions are hatched and semiconductor and metal regions are clear.

DETAILED DESCRIPTION OF THE DRAWINGS

While the present invention is for particular combinations of N and P regions and for silicon semiconductor, this is merely for convenience of explanation and not intended to be limiting. As those of skill in the art will appreciate based on the description herein, P and N may be interchanged or other combinations of P and N regions used, and other semiconductor materials employed.

Figure 1:
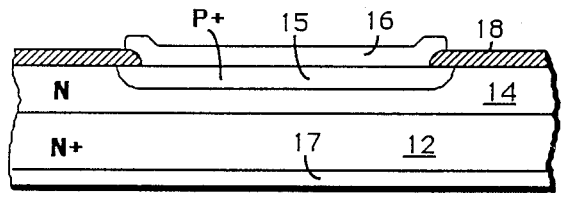
FIGS. 1-4 are simplified schematic cross-sectional views of portions of a semiconductor wafer illustrating the construction of various semiconductor devices according to the prior art.
Figure 2:
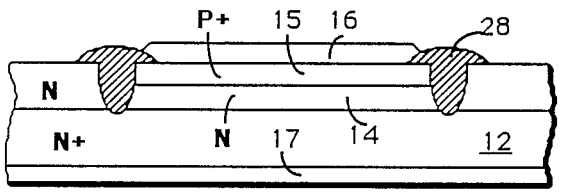

FIGS. 1-4 show simplified schematic cross-sectional views of portions 10, 20, 30 and 40 of a semiconductor wafer illustrating rectifiers constructed according to the prior art. FIGS. 1-2 illustrate rectifiers which are constructed in epitaxial wafers.

Referring now to FIGS. 1-2, N+ substrate 12 has thereon N type epitaxial layer 14 in which has been formed P+ region 15. Passivation layer 18 is provided to passivate the edge of the PN junction formed between regions 14, 15. Metallization 16 is provided in contact with P+ region 15 and metallization 17 is provided in contact with N+ region 12. FIG. 1 shows a planar type structure and FIG. 2 shows a mesa type structure. Glass 28 has been provided over the intersection of the PN junction formed between regions 14, 15 where the sides of the mesa have been etched into substrate 12. Means and method for constructing the structures shown in FIGS. 1-2 are well known in the art.

Figure 3:
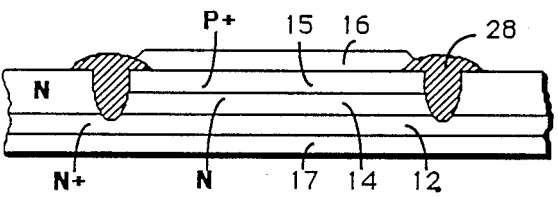
Figure 4:
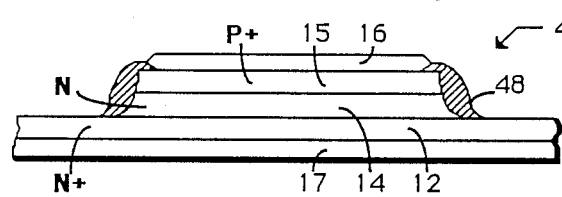

FIGS. 3-4 show additional examples of mesa type rectifier structures, but formed in non-epitaxial material. N type substrate 14 has P+ region 15 formed in its upper surface and N+ region 12 formed in its lower surface. Metallization regions 16, 17 are provided in the same manner as in connection with FIGS. 1-2. Passivation 28 is provided in the isolation grooves that extend through N type region 14 into N+ region 12. FIGS. 3 and 4 differ only in the amount of semiconductor material that has been removed in order to form the mesa. Passivation material 48 in FIG. 4 is analogous in function to passivation material 28 in FIGS. 2-3.

The epitaxial wafers used to form the structures shown in FIGS. 1-2 are comparatively expensive and therefore not suitable for devices which have large active areas and which are extremely cost sensitive, as for example, power diodes and transistors.

The structures illustrated in FIGS. 3-4 needs to be constructed in extremely thin wafers in order to avoid large forward voltage drop between the rectifying PN junction at the intersection of regions 14, 15 and N+ region 12 on the backside of the wafer. Because the grooves forming the isolating regions which separate the mesa devices must extend a substantial distance through the wafer, the probability of wafer breakage during processing is substantially increased. This reduces the yield and increases the manufacturing cost.

A further difficulty with the prior art structures illustrated in FIGS. 1-4, is that region 15 which forms one side of the PN junction is formed directly in an outer surface of the wafer. Because this is so, great care must be taken prior to device processing, to obtain wafers which have a minimal amount of surface structural defects. Since surface structural defects are inevitably produced as a result of the sawing and polishing operations used to form semiconductor wafers, the wafers must be pre-treated prior to device processing in order to remove these damaged surface regions. This increases the starting wafer cost even for non-epitaxial wafers.

Figure 5:
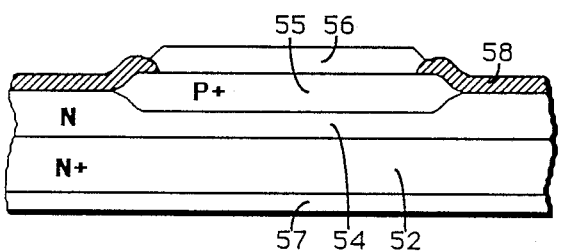
FIGS. 5-6 are simplified schematic cross-sectional views of portions of a semiconductor wafer, similar to those illustrated in FIGS. 1-4, but according to the present invention.
Figure 6:
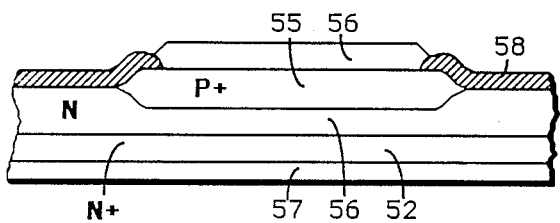
Figure 7:
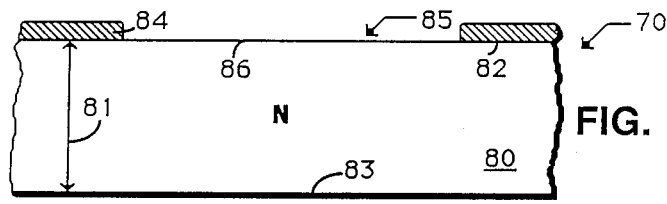
FIGS. 7-13 show simplified schematic cross-sectional views of portions of a semiconductor wafer according to the present invention during various stages of construction.

The foregoing and other limitations and disadvantages of the prior art are avoided by the method and structure of the present invention which is illustrated in FIGS. 5-13. FIGS. 5-6 show simplified schematic cross-sectional views of portions 50,60 of a semiconductor wafer illustrating the structure of the device formed according to the present invention in an epitaxial wafer (FIG. 5) and in a non-epitaxial wafer (FIG.6). The N, N+ and P+ regions in FIGS. 5-6 are analogous in function to those in FIGS. 1-4.

Referring now to FIG. 5, N+ substrate 52 has thereon N type epitaxial layer 54 in which is formed P+ region 55. Metallization 56 is provided on P+ region 55 and metallization 57 is provided on N+ region 52. Passivation 58 covers the intersection of the PN junction between regions 54, 55 with the device surface. It will be noted that in the structure of FIGS. 5-6, P+ region 55 may protrude slightly from the semiconductor surface. It will also be noted, that the contour of the intersection of the junction between regions 54, 55 and the substrate surface is more gradual than in the planar structure of FIG. 1 or the mesa structures of FIG. 2, thereby providing for better control of the electric field. Because of its lower material cost, the structure of FIG. 6 is preferred.

The method of construction of the device according to the present invention is illustrated in FIGS. 7-13 which show schematic cross-sections of device portion 70 similar to those in FIGS. 1-6 but at different stages of fabrication. For convenience of explanation, the process utilized for forming the preferred structure of FIG. 6 is illustrated in FIG. 7-13. Those of skill in the art will understand based on the description herein how an epitaxial starting wafer may be used so as to arrive at the structure of FIG. 5.

Referring now to FIG. 7-13, N type starting wafer 80 having initial thickness 81 and major surfaces 82, 83 is provided. Masking layer 84 having opening 85 exposing portion 86 of surface 82 is provided using means well known in the art. Masking layer 84 may be of any convenient material which is resistant to etchants or other means for removing a portion of substrate 80.

Figure 8:
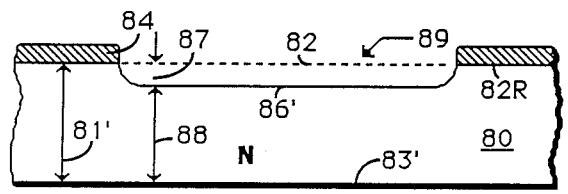

As illustrated in FIG. 8, that portion of substrate 80 exposed in opening 85 is removed, for example by etching, to a depth 87 from initial wafer surface 82 so as to provide cavity 89 having a newly exposed surface 86' under opening 85 and leave portion 82R of original surface 82 under mask 84 laterally outside cavity 89 . It is desirable, but not essential, that rear surface 83 of substrate 80 also be etched at the same time that portion 86 of front surface 82 is etched so that wafer thickness 81 is reduced to amount 81' between initial surface 82 and newly etched rear surface 83'. In this fashion distance 88 between bottom surface 86' of cavity 89 under opening 85 and rear surface 83' is less than starting thickness 81 by approximately twice cavity depth 87.

Figure 9:
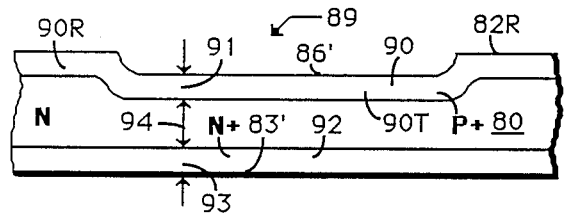

Referring now to FIG. 9, mask 84 is removed and P+ region 90 having junction depth 91 is formed in surface 86' in cavity 89 and in surface 82R surrounding the cavity. Conveniently, but not essentially, N+ region 92 having depth 93 is formed in rear wafer surface 83'. N+ region 92 and P+ region 90 are separated by distance 94 which is referred to in the art as the "base width". Central portion 90T of P+ region 90 is located under surface 86' on the bottom and the sides of cavity 89.

It is desirable but not essential that P+ region 90 and N+ region 92 be diffused simultaneously. Means for simultaneously doping opposed surfaces of a wafer with opposite type dopants are well known in the art. For example, sources of opposite type dopants held in a liquid suspension may be sequentially sprayed on or spun onto opposed faces 86' and 82R, 83' of substrate 80 and then simultaneously heated in a suitable atmosphere in a diffusion furnace. Alternatively, multiple wafer substrates 80 may be placed in a diffusion furnace such that dopant source wafers of opposite type are sandwiched between each successive semiconductor wafer and the combination heated so that dopant released from each source wafer diffuses substantially only into the adjacent semiconductor surfaces. Such arrangement is also well known in the art. Those of skill in the art will understand how to select the times and temperatures needed to achieve the dopant depths 91, 93 suitable for the particular device desired.

Figure 10:
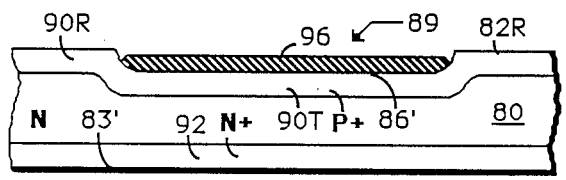
Figure 11:
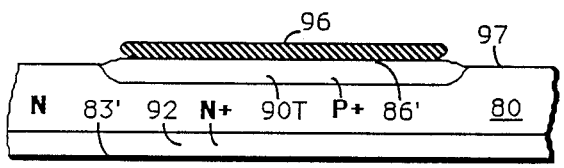

Referring now to FIG. 10, mask 96 is placed in cavity 89 so as to substantially cover central portion 90T of P+ layer 90 and leave exposed peripheral portion 90R of P+ layer 90. Masking layer 96 must be resistant to etching means capable of removing part of substrate 80. Photoresist is suitable. As illustrated in FIGS. 10–11, doped region 90R under surface region 82R laterally outside of cavity 89 and mask 96 is removed so as to provide newly exposed surface 97 of N-type substrate 80 substantially surrounding central portion 90T of P+ region 90 under mask 96.

Cavity depth 87, junction depth 91 and the amount of etch-back of surface region 82R should be arranged so that the etch-back of surface region 82R exceeds junction depth 91 in at least some region surrounding central portion 90T so that at least part of region 80 is re-exposed. This may take the form of completely removing portion 90R surrounding central portion 90T or etching a shallow moat through part of region 90R surrounding portion 90T. In either case, some part of region 80 is re-exposed to terminate the active junction between central portion 90T and substrate 80. Removing substantially all of portion 90R leaving portion 90T is preferred.

Cavity depth 87 may be larger of smaller than junction depth 91 or vice versa. It is desirable that cavity depth 87, junction depth 91 and the etch-back be arranged so that the PN junction formed between remaining region 90T and substrate 80 intersects newly exposed surface 97 under etched away portion 90R of surface 82R at an angle greater than ninety degrees, measured within region 80. It is convenient but not essential that portion 90T is even with or slightly protrudes above surface 97 of substrate 80.

Figure 12:
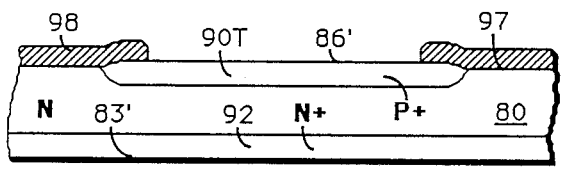
Figure 13:
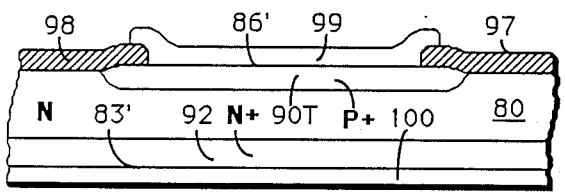

Referring now to FIGS. 12–13, passivation 98 is provided using means well known in the art over newly exposed portion 97 of substrate 80. Surface portion 86' of P+ region 90T is left exposed so as to be able to receive metallization 99 (FIG. 13). Metallization 100 is provided on N+ region 92. The structure shown in FIG. 13 is analogous to that shown in FIG. 6.

EXAMPLE

Rectifier diodes are constructed according to the steps in FIG. 7–13 on 75–100 mm diameter N type silicon wafers having an initial thickness in the range of 0.3–0:4 mm. Openings 85 are typically rectangular or circular with major lateral dimensions in the range of about 0.5–5 mm. Approximately 0.05–0.08 mm of material is removed from each face of the wafer in forming cavity surface 86' and newly etched rear face 83', such that dimension 88 (FIG. 8) is of the order of 0.15–0.3 mm with 0.2 mm being typical.

The wafers are then simultaneously diffused using a maskless diffusion with either spin-on, spray-on, or preformed doping sources to provide dopant depths of the order of 0.05–0.8 mm. This was typically accomplished at approximately 1300 degrees centigrade. Resulting base-width 94 was 0.045–0.13 mm, typically 0.075 mm.

Photoresist is used to provide mask 96 and surface region 82R of substrate 80 is etched to remove doped portions 90R using a mixture of nitric acid, hydrofluoric acid and water. Such etchants are well known in the art.

Following the etching step illustrated in FIG. 11, mask 96 is removed and passivation 98 provided using means well known in the art. Passivation 98 may be glass or oxide or organic passivation material or a combination thereof. As shown in FIG. 13, metallization 99, 100 is applied to the wafer and delineated using conventional methods. Various metals may be used with Cr/Ni/Au or Ni/Ni/Au or Al being examples of suitable materials. Typical metal thicknesses are in the range of 0.3–1 micrometer with 0.5 micrometers being typical.

Devices fabricated according to the above described method show improved mechanical yield (reduced wafer breakage) during processing and electrical characteristics which are equal to or better than those of prior art devices of similar dimension and features.

Referring again to FIG. 7–13, it will be noted that original surfaces 83, 86, of starting material 80 are etched to considerable depths everywhere over the entire active area and the areas immediately surrounding the active area of the device. This ensures that any residual damage left from sawing and/or polishing the wafers is removed without any need for a separate damage removal step prior to device processing. This is a substantial advantage.

Further, because it is not necessary to etch deep isolation trenches extending from surface 82 to N+ region 92, the incidence of wafer breakage is substantially reduced. While various starting wafer thicknesses may be used and various amounts of material etched away in forming cavity 89 and etching rear face 83 of wafer 80, it is desirable that cavity depth 87 be of the order of 15–25 percent of initial wafer thickness 81 or, stated alternatively, that after cavity and rear face 83 of wafer 80 are etched, they are separated by a remaining portion of the substrate having thickness 88 approximately 50–70 percent of initial wafer thickness 81. This provides the proper compromise between having thickness of N type base region 80 between between P+ region 90T and N+ region 92 be small so as to minimize forward voltage drop while still maintaining substantial mechanical strength within the wafer during wafer processing.

An additional feature of the present invention is that maskless diffusion may be used. The sequence of steps is such that P+ region 90R outside the desired active area is automatically removed during processing by virtue of the etching steps so that it is not necessary to mask the P+ dopant during diffusion.

Based on the foregoing description it will be apparent to those of skill in the art that the means and method of the present invention provides semiconductor junctions, particularly rectifying junctions, that are adapted to low cost manufacture of non-epitaxial substrates, that are amenable to simultaneous diffusion of both the P+ and N+ regions on opposed faces of the wafer, that incorporate automatic removal of the sawing and polishing damage present on all wafers without a separate step therefore, that avoid having to mask the P+ diffusion and that provide a wafer of greater mechanical strength during processing so as to reduce breakage.

While the invention has been illustrated for silicon semiconductor wafers and for a particular combination of N, N+ and P+ regions, those of skill in the art will understand that other semiconductor materials can be used and that other combinations of N and P regions may also be fabricated. Those of skill in the art will understand, based upon the desired characteristics of the finished device, how to select the appropriate combination of N and P regions.

Accordingly, it is intended to include within the scope of the claims that follow all such variations and equivalents as will occur to those of skill in the art based on the teachings herein.

I claim:

1. A process for forming a semiconductor device, comprising:
   providing a semiconductor substrate having a principal surface of a first type;
   etching a cavity into the substrate from the principal surface, wherein the cavity has a bottom;
   forming a doped region of a second type opposite the first type having a first part in the principal surface and a second part in the bottom of the cavity;
   covering the second part of the doped region;
   removing at least a portion of the first part of the doped region around the cavity, thereby exposing a part of the substrate underneath the doped region outside the cavity; and
   exposing the second part of the doped region.

2. The process of claim 1 wherein the removing step comprises leaving the bottom of the cavity level with or protruding from the substrate.

3. The process of claim 2 further comprising, after the removing step, forming a passivation on the substrate over a periphery of the second part.

4. The process of claim 1 wherein the removing step comprises removing substantially all of the first part of the doped region.

5. The process of claim 1, wherein the principal surface is a first of two spaced apart principal surfaces of the substrate, and further comprising forming another doped region of the first type in the second principal surface of the substrate.

6. The process of claim 5 wherein the doped region is formed simultaneously with the doped region.

7. The process of claim 1 wherein the substrate has first and second principal surfaces separated by a predetermined first distance, and wherein the cavity is etched to a first depth from the first principal surface while a thickness of material substantially equal to the first depth is removed from the second principal surface.

8. The process of claim 7 wherein the first depth is about 15–25 percent of the predetermined first distance.

9. The process of claim 7 wherein, after the cavity and second principal surface are etched, they are separated by a remaining portion of the substrate having a thickness approximately 50–70 percent of the predetermined first distance.

10. A process for forming a semiconductor device, comprising:
    providing a semiconductor substrate having first and second principal surfaces separated by a first distance;
    forming a cavity having a bottom and sidewall extending into the substrate a second distance from the first surface, leaving a remaining portion of the first surface around the cavity;
    introducing a dopant to a third distance into the remaining portion of the first surface and the bottom and sidewall of the cavity;
    covering the bottom of the cavity;
    removing at least part of the remaining portion of the surface to a fourth distance into the substrate exceeding the third distance; and
    exposing the bottom of the cavity.

11. The process of claim 10 wherein the removing step comprises removing substantially all of the remaining portion of the surface to the fourth distance into the substrate.

12. A processs for forming a semiconductor device, comprising:
    providing a semiconductor substrate having first and second principal surface separated by a first distance;
    forming a cavity extending from the first surface into the substrate wherein the cavity has a bottom separated from the first surface by a second distance;
    introducing a dopant to a third distance into the cavity bottom and into a remaining part of the first surface laterally outside the cavity; and
    removing at least a portion of the remaining part of the first surface so that the bottom of the cavity is now level with or protrudes from the substrate and is surrounded by at least some newly exposed substrate not containing the dopant.

* * * * *